United States Patent [19]

Tam

[11] Patent Number: 5,107,404
[45] Date of Patent: Apr. 21, 1992

[54] CIRCUIT BOARD ASSEMBLY FOR A CELLULAR TELEPHONE SYSTEM OR THE LIKE

[75] Inventor: Ambrose W. C. Tam, Taipo, Hong Kong

[73] Assignee: Astec International Ltd., Hong Kong

[21] Appl. No.: 406,998

[22] Filed: Sep. 14, 1989

[51] Int. Cl.⁵ .......................... H04B 1/08; H05K 7/20
[52] U.S. Cl. .................................. 361/424; 361/395; 455/348
[58] Field of Search ................. 174/35 R, 35 GC, 51; 361/386, 388, 380, 395, 346, 399, 422, 424, 410, 414, 417, 419, 420, 429; 312/223; 334/85; 455/347, 348

[56] References Cited

U.S. PATENT DOCUMENTS

| | | | |
|---|---|---|---|
| 4,063,788 | 12/1977 | Latasiewicz | 455/347 |
| 4,370,700 | 1/1983 | Dwddles | 174/35 R |
| 4,404,617 | 9/1983 | Ohyama | 174/35 R |
| 4,587,593 | 5/1986 | Liautaud | 361/395 |
| 4,658,439 | 4/1987 | Danielsen | 455/348 |
| 4,679,728 | 7/1987 | Gregory | 361/395 |
| 4,736,266 | 4/1988 | Tanibe | 361/414 |
| 4,739,453 | 4/1988 | Kurokawa | 361/424 |
| 4,831,498 | 5/1989 | Baba | 174/35 GC |
| 4,837,664 | 6/1989 | Rodriguez | 361/424 |
| 4,920,955 | 4/1990 | Maier | 361/424 |

FOREIGN PATENT DOCUMENTS 3809607  10/1989  Fed. Rep. of Germany ...... 361/424

*Primary Examiner*—Gerald P. Tolin
*Attorney, Agent, or Firm*—McCubbrey, Bartels, Meyer & Ward

[57] ABSTRACT

A circuit board assembly for a cellular telephone system or the like is described. A housing encloses a printed circuit board. The housing comprises a frame including an outer wall surrounding the periphery of the printed circuit board and a pair of cover plates engaging the outer edges of the outer wall of the frame. The printed circuit board is secured to the frame, and the frame is secured between the cover plates by fasteners which pass through holes in the printed circuit board. A plurality of internal walls on the frame isolate components on the printed circuit board and engage a ground line on the printed circuit board. The printed circuit board is a multi-layer board designed to permit signal lines to pass underneath the ground lines. Components are amounted on both sides of the printed circuit board.

14 Claims, 4 Drawing Sheets

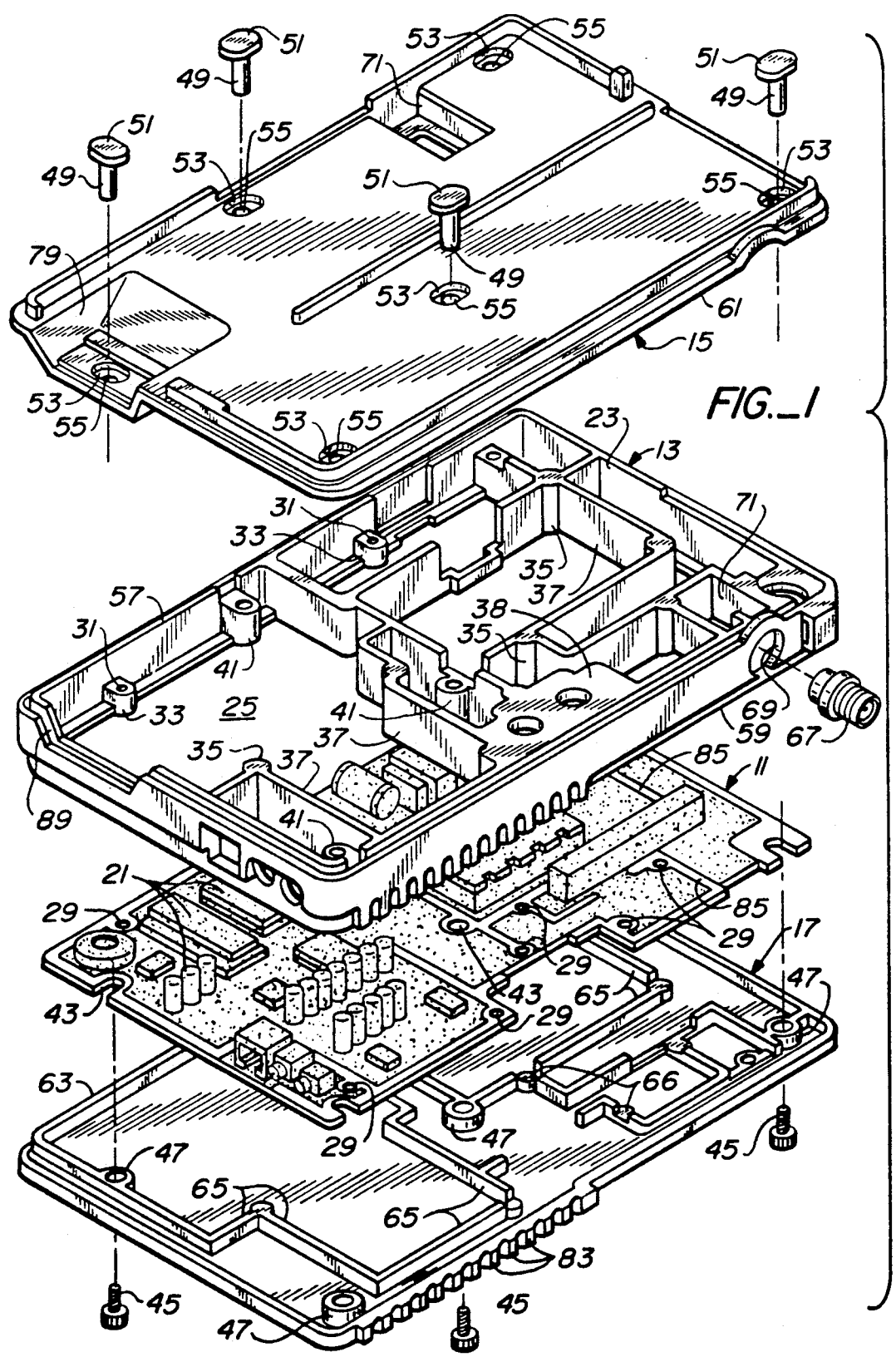
FIG._1

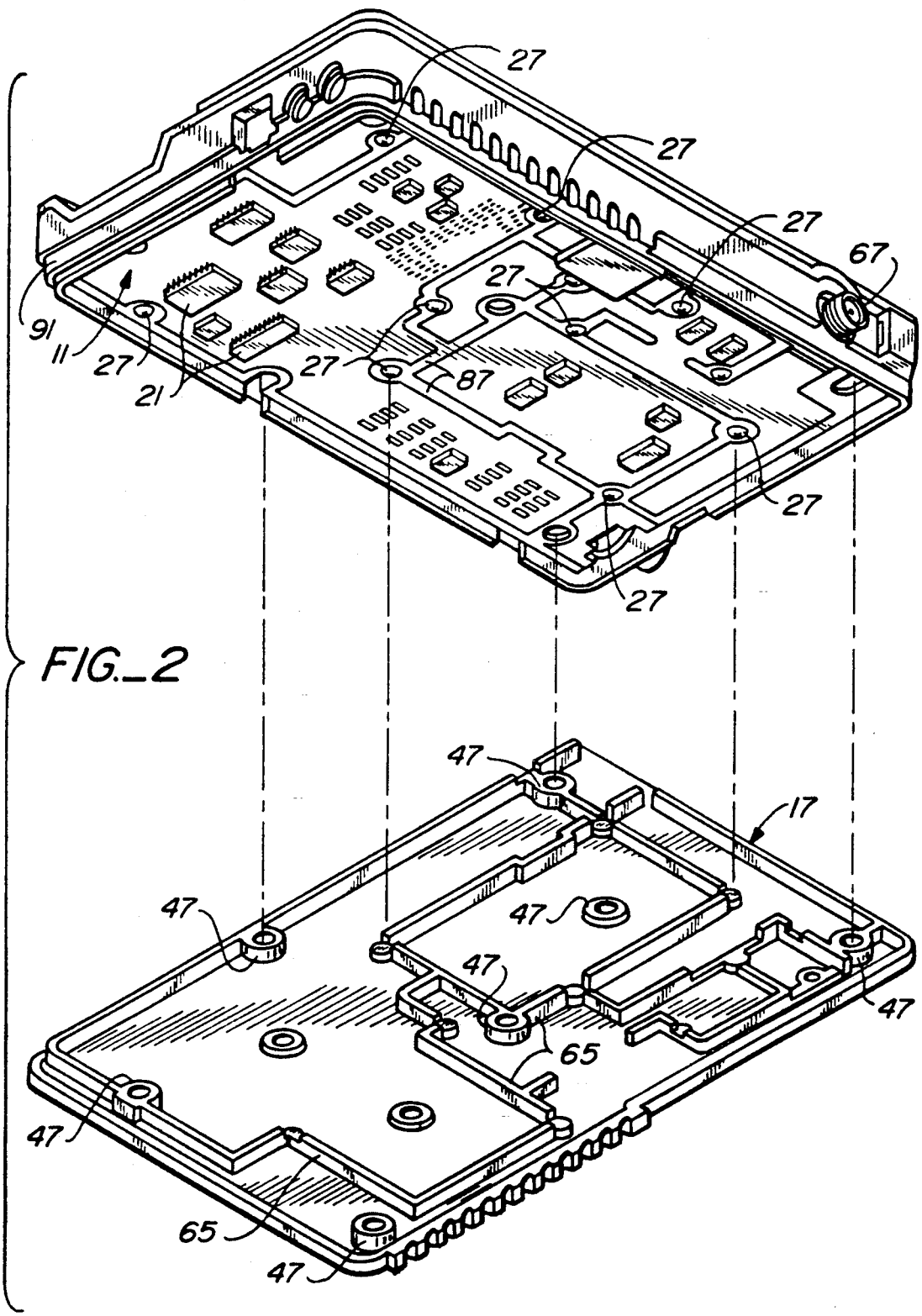

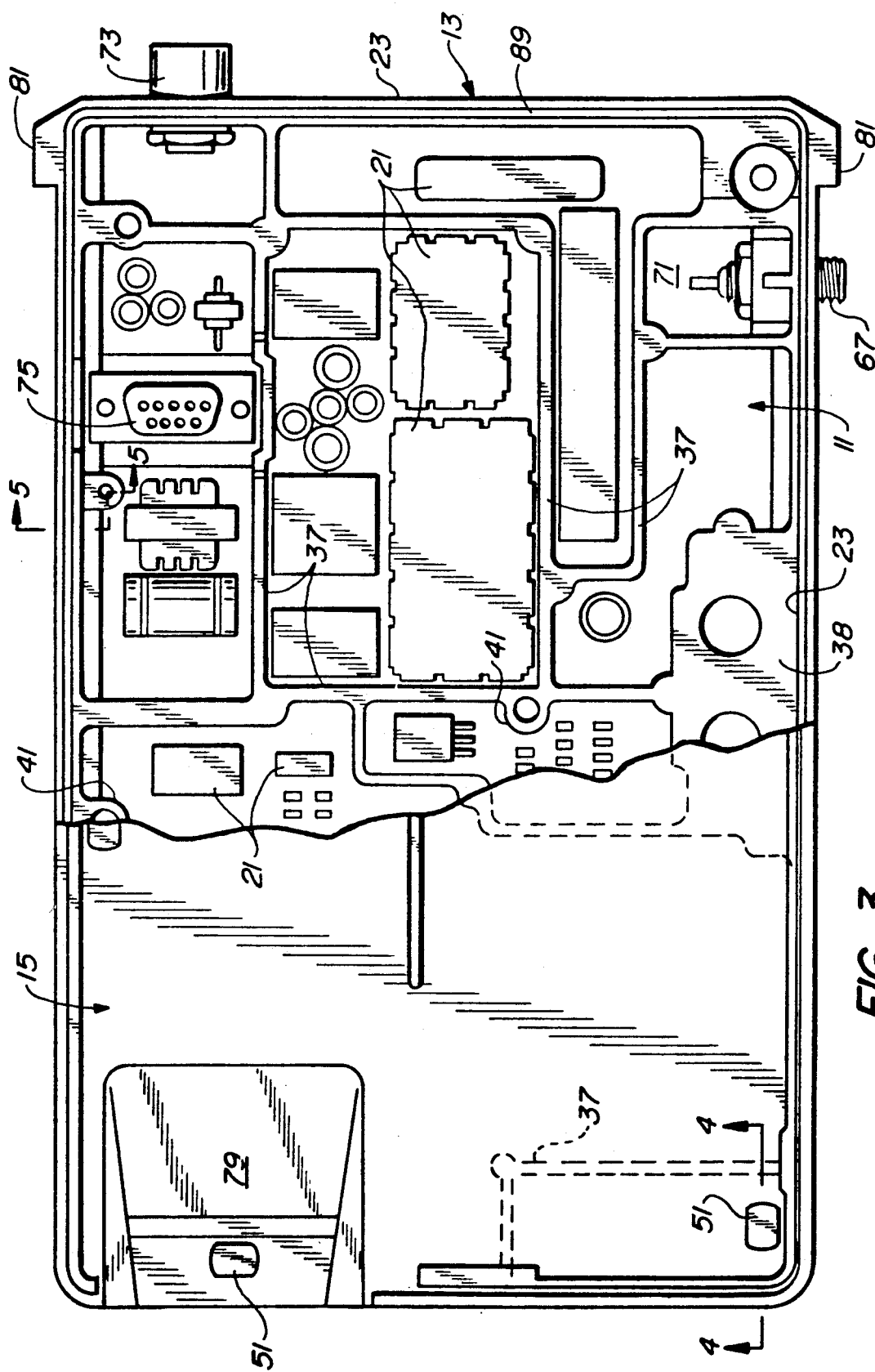

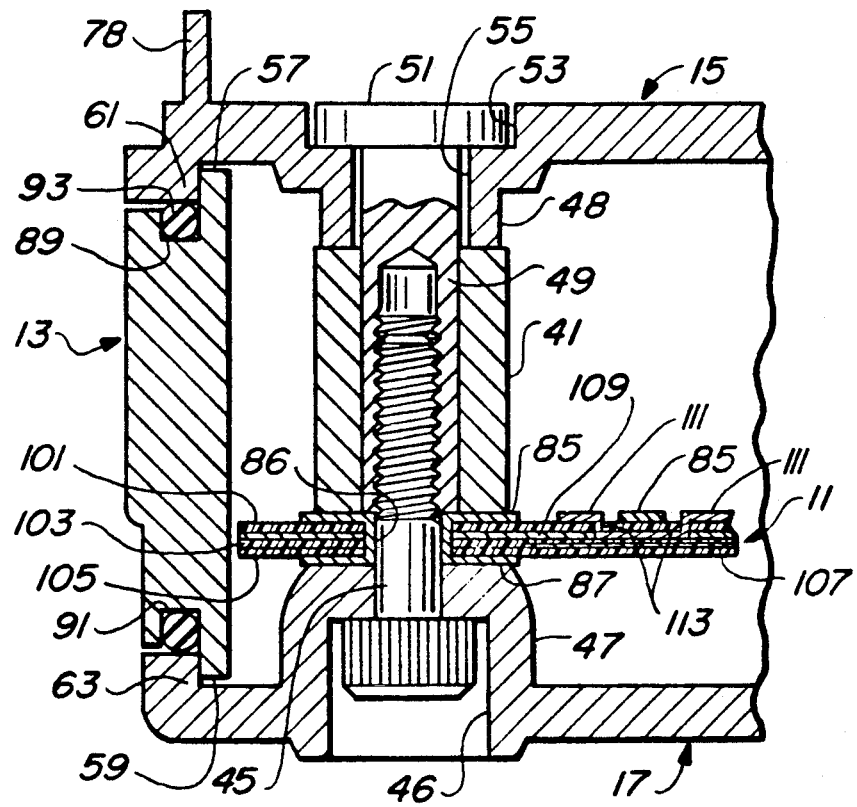
FIG._4
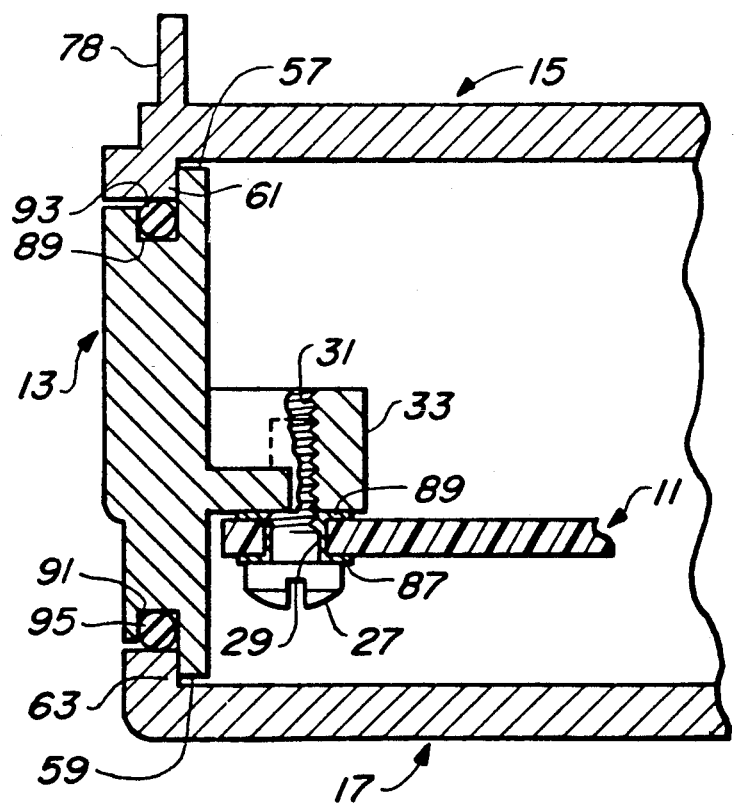
FIG._5

CIRCUIT BOARD ASSEMBLY FOR A CELLULAR TELEPHONE SYSTEM OR THE LIKE

This invention relates generally to printed circuit board assemblies. More particularly, the invention relates to an improved circuit board assembly for a cellular telephone system or the like wherein a printed circuit board is enclosed in a surrounding housing.

BACKGROUND OF THE INVENTION

Cellular telephone systems and other like electronic systems typically incorporate printed circuit boards upon which various electronic components of the system are mounted. The printed circuit board or, in some cases, a plurality of printed circuit boards, are enclosed within a housing which provides physical protection of the enclosed printed circuit board and electronic components and which, in many cases, also provides shielding from electromagnetic interference. For this latter purpose, the housing is typically comprised of an electrically conductive metal or metal alloy, or in some cases is a metalized plastic.

If access to components on the printed circuit board is required, such as for servicing or replacement, opening or disassembly of the surrounding housing becomes necessary. Typical prior art devices have employed housings comprised of cast elements with holes for self tapping screws used to assemble the housing elements. Repeated removal and replacement of self tapping screws can result in failure of the threads in a previously self tapped hole, reducing the integrity of a reassembled housing. Moreover, the utilization of self tapping screws for assembly of housing elements necessitates precise positioning of the screw holes in the casting. Such preciseness is often difficult to achieve in casting processes, resulting in low casting yields in some cases. Thus, it would be desirable to provide a circuit board assembly in which the number of self tapping screws is substantially reduced, and wherein the need for repeated removal and replacement of self tapping screws is eliminated.

Another problem encountered in the design of circuit board assemblies is in the necessity for isolation of particular electronic components which generate electromagnetic interference. The prior art has often employed sealed cans to enclose interference generating components, or has employed complex housing constructions with interior shielding in order to reduce problems of interference. For example, where an electronic device incorporates both transmission and reception circuitry, it is often necessary in the prior art to provide separate printed circuit boards for each of these two functions, with separate isolation. Such designs result in relatively complex and expensive circuit board assemblies. It would therefore be desirable to provide a printed circuit board assembly which is of relatively simple construction and yet which provides for proper shielding of interference generating components.

A further problem in the design of printed circuit board assemblies is in weatherproofing the structure. The problems described above, which often result in more complex designs, have also increased the problems of protecting the delicate printed circuit board and electronic components from the elements. The incorporation of various types of seals in such complex structures clearly increases the cost of the resulting devices. It would therefore be desirable to provide a printed circuit board assembly having a design which facilitates weatherproofing of the printed circuit board and electronic components without introducing a high degree of complexity in accomplishing the sealing.

OBJECTS OF THE INVENTION

Accordingly, it is an object of the invention to provide an improved printed circuit board assembly for a cellular telephone system or the like.

Another object of the invention is to provide an improved circuit board assembly which eliminates the danger of stripping of self tapping screws used to secure housing elements.

Another object of the invention is to provide an improved circuit board assembly wherein RF interference generating components are adequately shielded and yet which is of simple, low cost construction.

Another object of the invention is to provide an improved circuit board assembly which is substantially weatherproof and wherein the sealing means are of relatively low cost and simple construction.

It is yet another object of the invention to provide an improved circuit board assembly wherein the circuit board and electronic components are readily accessible for servicing and replacement.

Other objects of the invention will become apparent to those skilled in the art from the detailed description which follows, taken in connection with the accompanying drawings.

BRIEF DESCRIPTION OF THE DRAWINGS

FIG. 1 is an exploded perspective view of a printed circuit board assembly constructed in accordance with the invention.

FIG. 2 is a perspective view of the underside of the assembly of FIG. 1 shown in the top portion of the figure, and with the lower cover plate removed and tilted to show the interior surface thereof in the lower portion of the figure.

FIG. 3 is a plan view, with part of one of the cover plates broken away, of the assembly of FIGS. 1 and 2.

FIG. 4 is sectional view taken along the line 4—4 FIG. 3.

FIG. 5 is a sectional view taken along the line 5—5 of FIG. 3.

SUMMARY OF THE INVENTION

Very generally, the printed circuit board assembly of the invention comprises a printed circuit board having a plurality of electronic components thereon. A housing encloses the printed circuit board. The housing comprises a frame having an outer wall substantially surrounding the periphery of the printed circuit board and defining an interior space. The frame includes mounting means mounting the printed circuit board to the frame to span the interior space defined by the frame. The housing further comprises first and second cover plates spanning the interior space defined by the outer wall of the frame on opposite sides of the printed circuit board to thereby enclose the printed circuit board within a housing chamber defined by the outer wall of the frame and the first and second cover plates. The first and second cover plates are directly connected to each other such that the first and second cover plates are urged against the frame to secure the frame between the first and second cover plates.

DETAILED DESCRIPTION OF THE INVENTION

Referring now FIG. 1, the assembly of the invention is shown in an exploded perspective view. The printed circuit board 11 is thus shown in exploded relation with the frame 13 and first and second cover plates 15 and 17. The orientation of the assembly and its components as shown in FIG. 1 is merely to present an orientation which is convenient for illustration. The particular orientation of the device does not form a part of the invention and is thus not limited to what is shown in the drawings. The material of which the frame 13 and cover plates 15 and 17 are comprised is preferably a cast aluminum alloy. However, other electrically conductive materials may be suitable, including, for example, molded plastic having an interior coating of aluminum or other conductive metal.

The printed circuit board 11 may be of any suitable construction, depending upon the particular purpose intended for the printed circuit board assembly. The particular circuit board illustrated is designed for use in connection with a cellular telephone system and carries appropriate electronic components of various shapes and forms illustrated generally at 21. In a cellular telephone system, for example, such components typically include microprocessor chips, RF generators, and transmitting and receiving transducers, as well as other appropriate components, all of which are well known to those skilled in the art and are described in other publication which are generally available. The components shown in the drawing are for the purposes of illustration only and it is to be understood that the invention is not limited to use in connection with the electronic components illustrated.

In a preferred form of the invention, the various electronic components 21 are mounted on the printed circuit board 11 on both sides thereof. The opposite side of the printed circuit board 11 from that seen in FIG. 1 may be seen in FIG. 2. It may be seen that the underside of the circuit board 11 includes components 21 as viewed in FIG. 2.

The frame 13 includes an outer wall 23 which, when the assembly is in fully assembled condition, surrounds the periphery of the printed circuit board 11. The wall 23 defines an interior space, designated in FIG. 1 as 25. In assembled condition the printed circuit board 11 spans this space defined by the wall 23 as may be seen from FIGS. 2 and 3. The printed circuit board 11 is mounted to the frame 13 by mounting means which, in the illustrated embodiment, comprise self tapping screws 27, visible in FIG. 2. These self tapping screws pass through holes 29 formed in the printed circuit board 11 and are self tapped into holes 31 formed in the frame 13, some of which are visible in FIG. 1. Details of the attachment of the printed circuit board 11 to the frame 13 are more specifically illustrated in detail in FIG. 5. The holes 31 are formed in the frame 13 during the casting process and are located in interiorly extending mounting posts 33 formed integral with the outer wall 23 of the frame 13. In addition, the self tapping screws 27 tap into holes 31 formed in mounting posts 35 positioned within the interior space 25 defined by the wall 23. These mounting posts 35 are supported at the intersection of a plurality of transverse walls 37 which span the interior space 25 and which are formed in the casting process integral with the remainder of the frame 13.

Although the self tapping screws 27 and the holes 31 would be subject to the danger of thread damage during repeated removal and replacement, such removal and replacement is not necessary in the assembly of the present invention. This is because the removable cover plates 15 and 17 provide easy access to both sides of the printed circuit board 11 and to the components 21 thereon without necessitating the removal of the printed circuit board 11 from the frame 13.

Also cast integral with the frame 13 is a heat sink 38. The heat sink comprises a portion integral with the remainder of the housing which is of very large cross-section. The heat sink is positioned in intimate heat conducting relation to critical heat generating components of the apparatus in order to conduct heat away therefrom and into the remaining portion of the housing for dissipation.

In addition to supporting the mounting posts 35, the interior walls 37 also support a plurality of sleeves 41. The sleeves 41 are aligned with a corresponding plurality of holes 43 formed in the printed circuit board 11. The cover plates 15 and 17 are secured to each other such that the cover plates are urged against the frame 13 to secure the frame between the cover plates. To this end, a plurality of threaded screws 45 are provided. These screws pass through a corresponding plurality of bosses 47 formed integral with the cover plate 17 and pass through the holes 43 in the printed circuit board 11 to be threadably received in threaded receptacles 49, respectively. A recess 46 is provided in the boss 47 for accommodating and recessing the head of the screw 45. Bosses 48, similar to the bosses 47 on the interior side of the plate 17, are provided on the interior side of the plate 15 at the holes 55. This may be more clearly seen in FIG. 4, where the lower edge of the boss 48 engages the upper surface of the sleeve 41 as the two plates 15 and 17 are tightened toward one another by the screw 45.

Each of the receptacles 49 extends through a respective one of the sleeves 41 to mate with a corresponding screw 45. This detail may be seen in FIG. 4. An exception is the left hand most receptor 49 as viewed in FIG. 1. This receptor extends through a sleeve, not visible, which is integrally formed in the cover plate 15, but which is similar in configuration and function to the sleeves 41 formed in the frame 13. To prevent rotation of the receptors 49, each of the receptors is provided with an oval head 51. The oval head 51 mates in a corresponding oval recess 53 formed in the plate 15. A hole 55 is provided communicating with each of the recesses 53, respectively, to permit the corresponding receptor 49 to pass therethrough.

It will be apparent that the result is that the plates 15 and 17 are independently and directly secured to each other, passing freely through the sleeves 41 of the frame 13 and through the holes 43 in the printed circuit board 11. This urges the cover plates 15 and 17 against the frame 13 to secure the frame between the cover plates. Lateral displacement of the frame with respect to the cover plates is prevented by the sleeves 41. In addition, a shoulder, 57 and 59, respectively, is provided on the upper and lower edges of the wall 23 of the frame 13. The shoulder 57 engages with an overlapping shoulder 61 on the plate 15 and the shoulder 59 engages with an overlapping shoulder 63 on the plate 17. Although, in the illustrated embodiment, the shoulders are discontinuous, sufficient interlocking occurs as to further prevent lateral displacement of the plates with respect to the frame. A further function of the shoulders is to assist in locating the cover plates with respect to the frame and thus aligning the holes for the screws 45 and receptors 49. The shoulders also function to provide an RF shield to prevent leakage of electromagnetic or radio frequency induction, or high frequency spurious signals.

As may be seen in FIGS. 1 and 2, the plate 17 has interior extending walls 65 thereon. The walls 65 are in a configuration substantially corresponding to the configuration of the interior walls 37 of the frame 13. When the cover plate 17 is in position, the walls 65 align with the walls 37. The walls 37 and 65 thus define a plurality of sub-chambers interiorly of the housing comprised of the frame 13 and cover plates 15 and 17. These sub-chambers effectively isolate the various components therein from components elsewhere on the printed circuit board 11 by providing shielding from electromagnetic interference such as might be provided by components which generate radio frequencies.

Thus, for example, an antenna output connector 67 is mounted in an opening 69 in the frame 13. Antenna signals within the housing are isolated from the remainder of the components 21 by the sub-chamber indicated generally at 71. Further external connections 73 and 75 are shown in FIG. 3, and similar shielding provisions may be made for these connections, as well as for other internal components of the device. With respect to the external connection 75, a recess 77 is formed in the cover plate 15 to provide external access thereto. Various other external details on the housing, such as the recess 79, the slotted strap holders 81, and the serrations 83, are incidental to the use of the illustrated device and are not directly related to nor are they essential to the inventive aspects thereof. Further external features on the housing, for purposes not relevant to this invention, include the flange 78 extending upwardly from the plate 15, as well as other external features not noted further herein.

In order to further enhance the shielding effect of the walls 37 and 65, the walls are in contact, substantially along their entire length, with a ground plane line which corresponds to the edge of the interior walls. The ground plane line on the upper side of the printed circuit board in FIG. 1 is shown at 85, whereas the ground plane line on the underside of the printed circuit board 11 is shown in FIG. 2 at 87. It will be noted that the walls 65 are provided with notches 66 therein at various locations to accommodate clearance of internal components and elements, such as the heads of the screws 27. Referring to FIGS. 5 and 6, it may be seen that the external ground plane lines that each of the holes 29 and 43 in the printed circuit board 11 are plated through the holes.

As may be seen in FIGS. 1 and 2, a groove or recess is provided in both upper and lower edges of the wall 23 of the frame 13. The upper groove is indicated in FIG. 1 at 89 whereas the lower groove is indicated in FIG. 2 at 91. Referring to FIGS. 4 and 5, it will be seen that these grooves 89 and 91 are utilized for the purpose of accommodating gaskets 93 and 95, respectively. The gaskets surround the periphery of the frame 13 at the upper and lower edges of the wall 23 and provide a weather tight seal for the interior of the housing. Further sealing may be provided, if desired, at the screws 45 and receptors 49 by suitable gaskets or washers, not illustrated. However, because the screws 45 may be tightened down to compress the bosses 47 and sleeves 41 against the printed circuit board 11, and the bosses 48 against the sleeves 41, a pressure seal is thus created so that further gasket seals may not be necessary.

Referring to FIG. 4, cross-sectional details of the printed circuit board 11 are shown schematically. The printed circuit board is comprised of four layers or planes of conductor art work, separated by sub-boards 101, 103 and 105, respectively. The thickness of the conductors are exaggerated for clarity. The lower surface of the sub-board 105 includes electrical art work or copper conductor strips for signal interconnection between various components (not shown) mounted on the PC board. Similarly, the upper surface of the sub-board 101 also contains electrical art work or copper strip conductors to provide signal interconnection between various components (not shown) mounted on the upper surface of the PC board. The two inter-layers comprise a power plane at 107 and a ground plane at 109.

It may be seen that the ground plane 109 is contiguous with the plated through holes 86 forming an electrical connection therewith to bring the ground plane potential out to the ground lines 85 on the upper surface of the printed circuit 11. The ground lines 85 coincide with the inner walls 37 to form contact therewith, thus grounding the housing. In order to permit the signal lines to tunnel under the ground lines 85, and thus interconnect components contained in different internal chambers, the ground plane 109 is interrupted in a region of sufficient size to permit a pair of pass through conductors 113 to extend through the printed circuit sub-board 101 to interconnect in the vacated space of the ground plane. Thus, the signal lines 111 may tunnel under the ground lines 85 as needed in order to provide interconnection between respective internal chambers. A similar arrangement is made in connection with signal lines on the lower surface of the printed circuit board 111, passing up through vacated regions of the power plane to interconnect in a vacated region of the ground plane.

It is to be understood that the type of printed circuit board employed in the assembly of the invention may be different from that shown and described herein. For example, a conventional double-sided printed circuit board may be used instead of the multi-layer board described above. In the case of a double-sided board, a ground layer similar to that employed in the multi-layer board described above may be simulated by using a one side insulated copper foil in the areas of the interior walls 37 and 65. The notches 66 may be positioned to allow signal conductive tracks to pass from one interior chamber to another, with the one side insulated copper foil being interrupted at the notch 66 to permit the signal track to pass there-through. The basic result is the same as with the multi-layer board described above, since the one side insulated copper foil contacts the inner walls to provide a ground connection, whereas the notches 66 permit passage of the signal track between interior chambers.

It may be seen, therefore, that the printed circuit board assembly of the invention differs from other prior art devices in that it does not utilize any self tapping fasteners which require repeated removal and replacement for access to internal components. The electronics may be mounted on a single printed circuit board on both sides thereof, and are effectively shielded from electromagnetic interference by means of internal walls integral with the housing. Access to the internal components is achieved by removal of a pair of cover plates from the supporting frame. These plates are secured directly to each other but not directly to the frame, and are secured by means other than self tapping screws. The design permits weatherproofing by means of a simple sealing arrangement. The printed circuit board may be, and is preferably of, multi-layer construction with electronic components mounted on both sides. At least one interior layer is a ground plane whereas the other interior layer is a signal plane.

Various modifications of the invention, in addition to those shown and described herein, will become apparent to those skilled in the art from the foregoing description and accompanying drawings. Such modifications are intended to fall within the scope of the appended claims.

What is claimed is:

1. A circuit board assembly for a cellular telephone system or the like, comprising: a printed circuit board having multiple layers including an interior ground plane and an interior signal plane and further having a plurality of electronic components thereon and further having a plurality of ground plane lines and a plurality of signal plane lines on an outer surface which is opposite said electronic components, wherein said ground plane is interrupted in defined regions to permit said signal plane lines to tunnel underneath said ground plane lines, said printed circuit board further having a plurality of holes therein which are plated through to interconnect said interior ground plane with said ground plane lines, said circuit board assembly further having a housing for enclosing said printed circuit board, said housing comprising a frame having an outer wall substantially surrounding the periphery of said printed circuit board and defining an interior space, said frame further including a plurality of interior walls spanning said interior space, said frame including mounting means mounting said printed circuit board to said frame to span the interior space defined by said frame, said ground plane lines on said printed circuit board being in alignment with and electrically engaging the adjacent edge of said interior walls of said frame, said housing further comprising first and second cover plates spanning the interior space defined by said outer wall of said frame on opposite sides of said printed circuit board to thereby enclose said printed circuit board within a housing chamber defined by said outer wall of said frame and said first and second cover plates, one of said cover plates having interiorly extending walls thereon corresponding to and in alignment with said interior walls of said frame on the opposite side of said printed circuit board therefrom and electrically engaging said ground plane lines on said printed circuit board, said interior walls forming a plurality of sub-chambers within said housing chamber, said sub-chambers being arranged to isolate respective ones of said electronic components on said printed circuit board, and securing means directly connecting said first and second cover plates to each other independently of said printed circuit board and said frame such that said first and second cover plates are urged against said frame to secure said frame between said first and second cover plates.

2. An assembly according to claim 1 wherein said securing means comprise a plurality of threaded connectors extending between said first and second cover plates, and wherein said printed circuit board includes a plurality of holes aligned with said threaded connectors to permit said threaded connectors to pass therethrough.

3. An assembly according to claim 2 wherein said frame further includes a plurality of sleeves supported by said inner walls, each of said sleeves being aligned with and surrounding a respective one of said threaded connectors.

4. An assembly according to claim 3 wherein at least one of said cover plates includes bosses extending interiorly thereof surrounding said threaded connectors, said bosses being of a length to engage said printed circuit board when said one cover plate is urged against said frame.

5. An assembly according to claim 4 wherein the other one of said cover plates include a plurality of bosses extending interiorly thereof surrounding said threaded connectors, said bosses being of a length to engage said sleeves when said one cover plate is urged against said frame.

6. An assembly according to claim 1 including sealing means surrounding the opposite edges of said outer wall of said frame which engage said cover plates to weatherproof said circuit board assembly.

7. An assembly according to claim 6 wherein said sealing means include a gasket.

8. An assembly according to claim 6 wherein said sealing means include shoulder means on said frame, and wherein said first and second cover plates are provided with corresponding shoulder means which interengage with said shoulder means on said frame.

9. A circuit board assembly for a cellular telephone system or the like, comprising: a printed circuit board having a plurality of electronic components thereon, and a housing for enclosing said printed circuit board, said housing comprising a frame having an outer wall substantially surrounding the periphery of said printed circuit board and defining an interior space, said frame including mounting means mounting said printed circuit board to said frame to span the interior space defined by said frame, said housing further comprising first and second cover plates spanning the interior space defined by said outer wall of said frame on opposite sides of said printed circuit board to thereby enclose said printed circuit board within a housing chamber defined by said outer wall of said frame and said first and second cover plates, and securing means connecting said first and second cover plates to each other such that said first and second cover plates are urged against said frame to secure said frame between said first and second cover plates, said frame further including a plurality of interior walls spanning at least a portion of the interior space defined by said outer wall of said frame, said interior walls defining a plurality of sub-chambers integrally formed from said cover plates and said interior walls of said frame, said sub-chambers being arranged to isolate respective ones of said electronic components on said printed circuit board.

10. An assembly according to claim 9 wherein said printed circuit board includes ground plane lines thereon aligned with an adjacent edge of said interior walls for forming an electrical contact therewith.

11. An assembly accordingly to claim 9 wherein said printed circuit board is comprised of multiple layers and includes an interior ground plane and an interior signal plane, wherein said circuit board includes signal plane lines and ground plane lines on at least one exterior surface thereof, and wherein said ground plane is interrupted in defined regions to permit said signal plane lines to tunnel underneath said ground plane lines.

12. An assembly according to claim 9 wherein said printed circuit board is comprised of multiple layers and includes an interior ground plane, and ground plane lines on at least one exterior surface thereof, and wherein said printed circuit board includes a plurality of holes therein which are plated through to interconnect said interior ground plane with said ground lines.

13. An assembly according to claim 9 wherein at least one of said cover plates includes a plurality of walls thereon extending inwardly therefrom in alignment with said interior walls on said frame on the opposite side of said printed circuit board therefrom.

14. An assembly according to claim 13 wherein said printed circuit board includes ground plane lines thereon aligned with adjacent edges of said interior walls of said frame and with said inwardly projecting walls on said cover plate to form electrical contact therewith.

* * * * *